(12) United States Patent
Ito

(10) Patent No.: US 6,989,995 B2
(45) Date of Patent: Jan. 24, 2006

(54) CAPACITOR MOUNTING STRUCTURE

(75) Inventor: Takeshi Ito, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 343 days.

(21) Appl. No.: 10/386,523

(22) Filed: Mar. 13, 2003

(65) Prior Publication Data

US 2004/0085742 A1 May 6, 2004

(30) Foreign Application Priority Data

Oct. 31, 2002 (JP) ............................... 2002-317776

(51) Int. Cl.
*H05K 7/06* (2006.01)

(52) U.S. Cl. ...................... 361/782; 361/770; 361/811; 174/260

(58) Field of Classification Search ........ 361/328–330, 361/522, 541, 734, 738, 760, 782, 783, 811, 361/820, 821, 830; 174/260
See application file for complete search history.

(56) References Cited

U.S. PATENT DOCUMENTS

| | | | | |
|---|---|---|---|---|
| 3,806,766 A | * | 4/1974 | Fanning | 361/782 |
| 3,912,984 A | * | 10/1975 | Lockhart et al. | 361/783 |
| 4,863,389 A | * | 9/1989 | Kobari et al. | 439/83 |
| 5,313,363 A | * | 5/1994 | Arbanas | 361/710 |
| 5,777,506 A | | 7/1998 | Kurachi et al. | 327/440 |
| 5,839,189 A | * | 11/1998 | Pomeroy et al. | 29/839 |
| 5,929,743 A | * | 7/1999 | Miyazaki et al. | 338/22 R |
| 6,008,991 A | * | 12/1999 | Hawthorne et al. | 361/707 |
| 6,012,223 A | * | 1/2000 | Hinze | 29/837 |
| 6,423,906 B2 | * | 7/2002 | Wang | 174/260 |
| 6,441,509 B1 | * | 8/2002 | Miller | 307/9.1 |
| 6,545,855 B1 | * | 4/2003 | Repplinger et al. | 361/308.1 |
| 6,631,071 B2 | * | 10/2003 | Kitagawa et al. | 361/328 |
| 2003/0024734 A1 | * | 2/2003 | Ineson et al. | 174/260 |

FOREIGN PATENT DOCUMENTS

| | | |
|---|---|---|
| JP | 11-288855 | 10/1999 |
| JP | 2000-151062 | 5/2000 |
| JP | 2000-286150 | 10/2000 |
| JP | 3191653 | 5/2001 |

* cited by examiner

*Primary Examiner*—John B. Vigushin
(74) *Attorney, Agent, or Firm*—Oblon, Spivak, McClelland, Maier & Neustadt, P.C.

(57) ABSTRACT

Electrode lead wires for each capacitor are soldered to land patterns of a mounting plate of insulation. Spacers each having a flexible structure composed of a grid of metal lines are mounted on electrode patterns printed on a printed circuit board, and tip portions of the electrode lead wires which project from the mounting plate are stuck into the spacers to provide mechanical contact therebetween. While keeping this contact, the mounting plate is secured with bolts to the printed circuit board. This forms a capacitor mounting structure. For replacement of the capacitors, by simply loosening the bolts, the entire mounting plate including all the capacitors can be demounted from the board.

14 Claims, 9 Drawing Sheets

F I G. 4
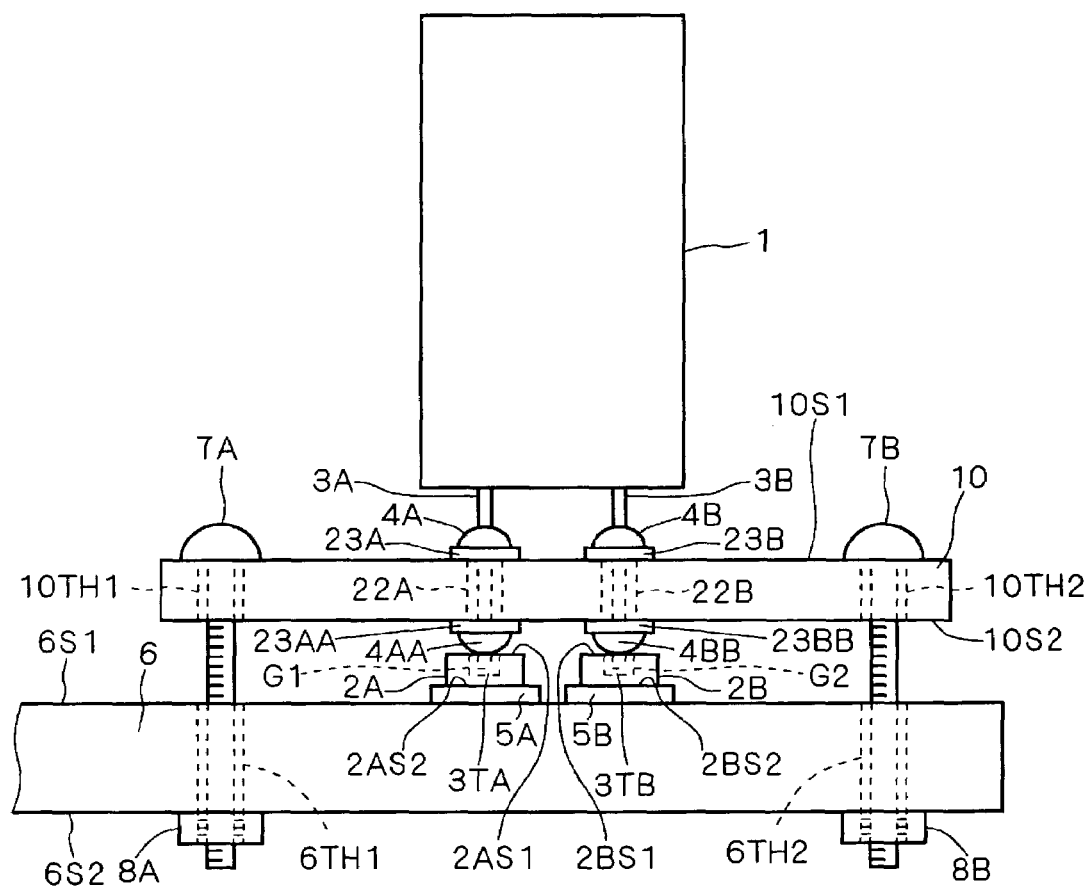

CAPACITOR MOUNTING STRUCTURE

BACKGROUND OF THE INVENTION

1. Field of the Invention

The present invention relates to a technique for arranging a plurality of capacitors (e.g., electrolytic capacitors) (hereinafter also referred to as a "capacitor assembly") having lead terminals on a board in such a way as to be able to be replaced at one time.

2. Description of the Background Art

The following have been proposed as well-known conventional techniques for arranging a capacitor assembly on a board.

Japanese Patent Application Laid-open No. 2000-286150 has, for example, described a capacitor assembly consisting of a plurality of capacitors which are united by being connected to each other at their respective terminals of the same polarity by a metal conductor.

Japanese Patent Application Laid-open No. 11-288855 has described a capacitor bank consisting of (six) electrolytic capacitors secured by a fixing band, the electrolytic capacitors each being configured by filling a space between a capacitor element and an outer case with a fixative for fixing the capacitor element.

Further, a conventional technique for replacing only short-lived electrolytic capacitors out of electronic components mounted on a printed circuit board has been proposed in, for example, Japanese Patent Application Laid-open No. 2000-151062. More specifically, according to this publication, spare through holes for connection to replacement electrolytic capacitors are formed in the printed circuit board, concentrically with through holes for connection to mounting electrolytic capacitors.

For shortest-lived electrolytic capacitors out of various electronic components constituting a semiconductor device, maintenance work or replacement of all electrolytic capacitors mounted on a single control board is essential. However, the maintenance work requires first the process of demounting all electrolytic capacitors from the board by melting, one by one for each electrolytic capacitor, a solder joint that electrically connects each lead terminal and an electrode pattern on the board, and then requires the process of soldering all replacement electrolytic capacitors one by one onto the board. In this way, the conventional maintenance work on electrolytic capacitors is complicated and a multi-step process, thus having a problem of requiring a relatively long time until completion of the work.

Such a problem is associated not only with the electrolytic capacitors, but in general, can turn up in common in any device having a board on which two or more capacitors having bipolar lead terminals or electrode lead wires are mounted.

SUMMARY OF THE INVENTION

It is an object of the present invention to provide a capacitor mounting structure that can facilitate capacitor replacement work in a semiconductor device.

The subject of the present invention is a capacitor mounting structure including a board, a first spacer of metal, a second spacer of metal, and a capacitor. The board has a first major surface having first and second electrode patterns formed thereon, and a second major surface facing the first major surface. The first spacer has a first bottom surface which is in mechanical contact with the first electrode pattern and a first upper surface which faces the first bottom surface, and it also has a deformable structure. The second spacer has a second bottom surface which is in mechanical contact with the second electrode pattern and a second upper surface which faces the second bottom surface, and it also has a deformable structure. The capacitor has a first electrode lead wire having a first tip portion electrically connected to the first upper surface, and a second electrode lead wire having a second tip portion electrically connected to the second upper surface.

The capacitor mounting structure according to the subject of the present invention allows, in capacitor replacement work, immediate demounting of the capacitor from the board without requiring any melting work for solder layers and also allows, after demounting of the capacitor, immediate mounting of a new replacement capacitor onto the board without requiring any soldering work.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view showing a capacitor mounting structure according to a first modification;

DESCRIPTION OF THE PREFERRED EMBODIMENTS

First Preferred Embodiment

Figure 1:
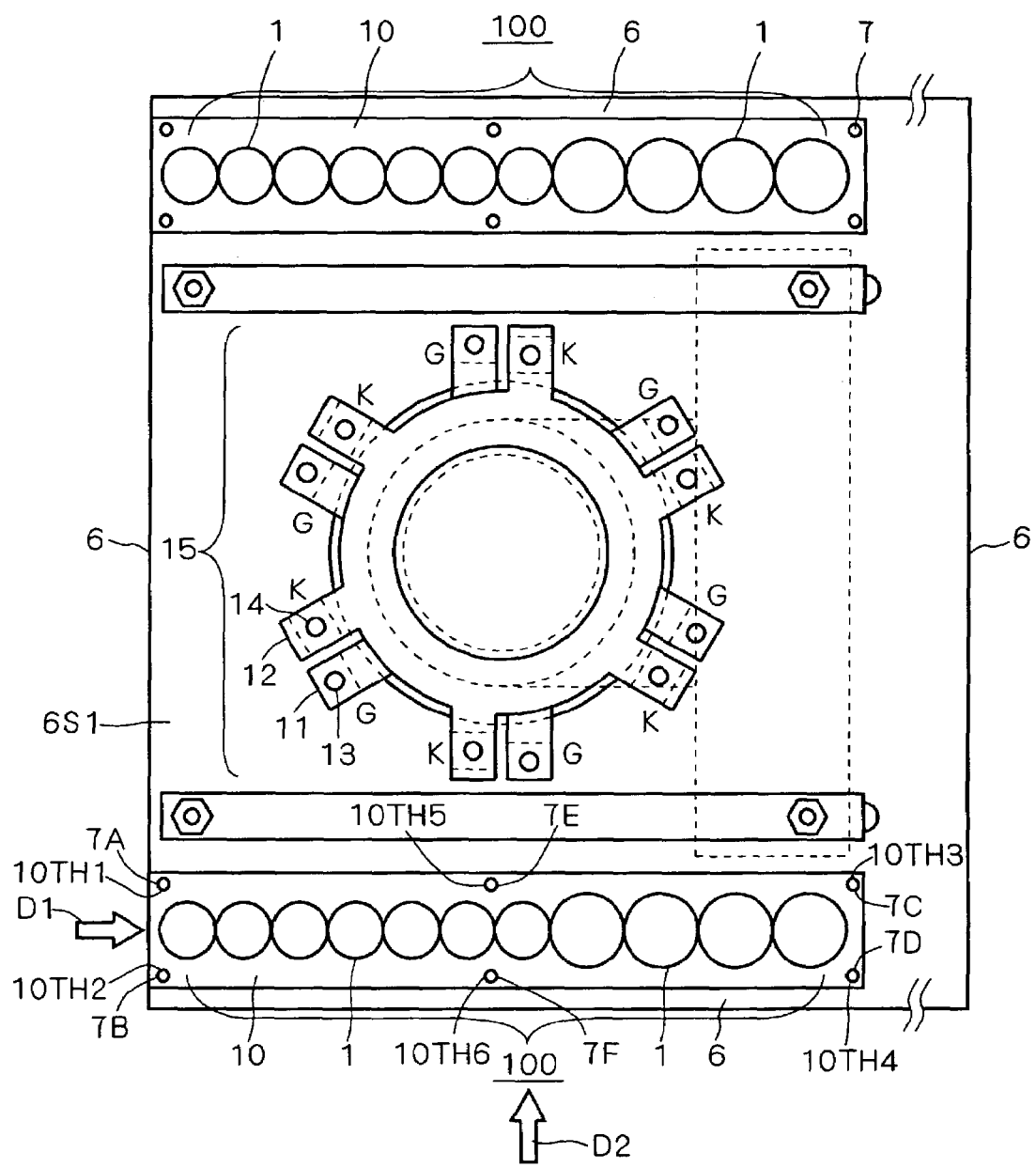
FIG. 1 is a plan view showing a semiconductor device according to a first preferred embodiment of the present invention.

FIG. 1 is a plan view schematically illustrating the main part of a semiconductor device having a capacitor mounting structure according to this preferred embodiment. This preferred embodiment employs, as an example of a semiconductor device, a thyristor device having a gate commutated turn-off thyristor element (GCT element: the operating principle and structure thereof and a semiconductor device circuit configuration using such a GCT element are described in detail in Japanese Patent No. 3191653 and in U.S. Pat. No. 5,777,506) as a semiconductor element, but the semiconductor device is not limited to this example. Another preferred example of a semiconductor device is a power semiconductor device (e.g., an IGBT or a power MOSFET).

Referring to FIG. 1, a semiconductor element 15 is mounted on a control board (also referred to simply as a "board") 6 of, for example, a printed circuit board. More specifically, a cathode (K) electrode terminal 12 of the semiconductor element 15 is mounted with a mounting screw 14 to a cathode electrode wiring pattern (not shown) provided on a first major surface 6S1 of the control board 6, and a gate (G) electrode terminal 11 of the semiconductor element 15 is mounted with a mounting screw 13 to a gate electrode wiring pattern (not shown) on the same surface 6S1. An anode electrode terminal (not shown) of the semiconductor element 15 is electrically mounted to a wiring pattern (not shown) on the rear surface side (a second major surface opposite the first major surface 6S1 with respect to a direction of thickness of the board) of the control board 6.

In upper and lower peripheral portions of the control board 6 as viewed from above the plane of the drawing in FIG. 1, capacitor assemblies 100 are located while each being supported by a mounting plate 10. The capacitor assemblies 100 each are an assembly of a plurality of electrolytic capacitors (hereinafter also referred to simply as "capacitors") 1 connected in parallel with each other. The structure for mounting the capacitor assemblies 100 on the control board 6 forms the heart or major characteristic of this preferred embodiment and will be described in detail with reference to FIG. 1 and other drawings.

On the right side (not shown) of the control board 6 as viewed from above the plane of the drawing in FIG. 1 is a main power supply circuit (not shown) for this semiconductor device including the semiconductor element 15.

Figure 2:
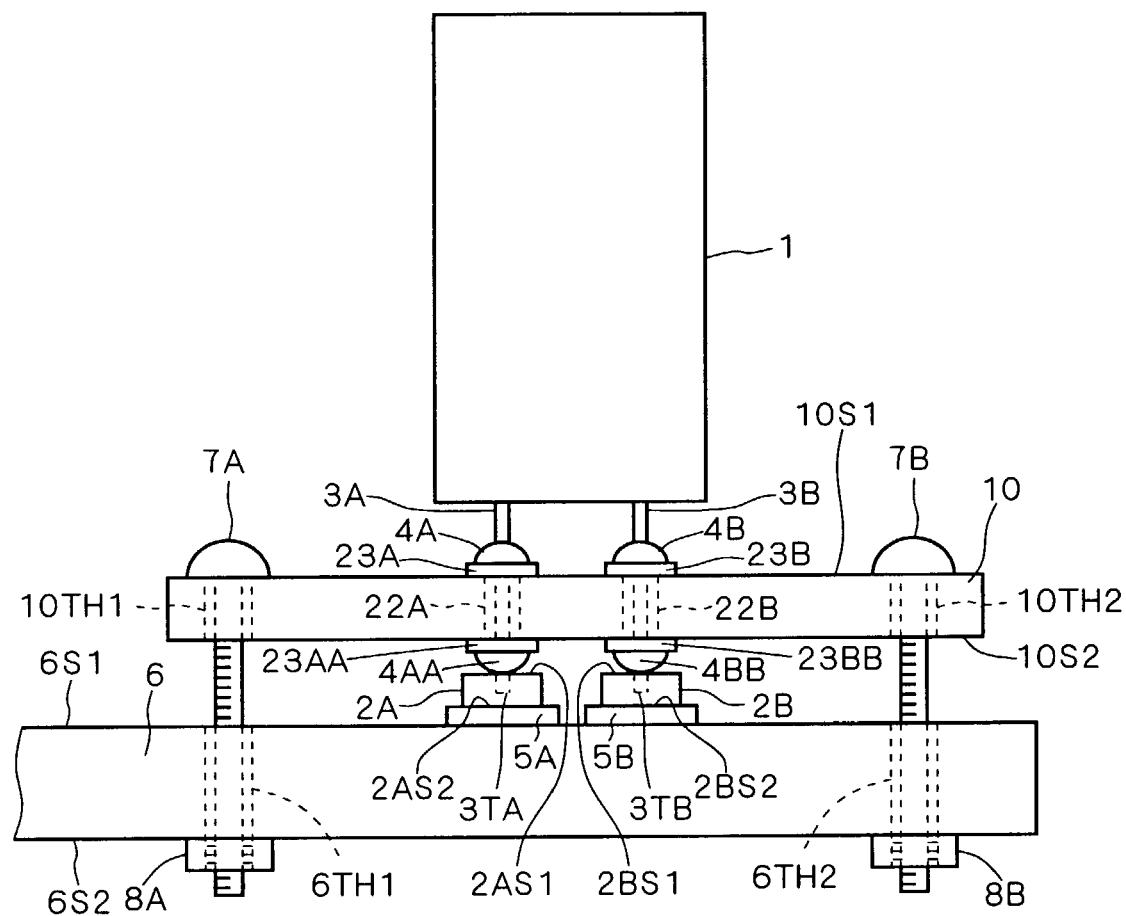
FIGS. 2 and 3 are side views showing a capacitor mounting structure according to the first preferred embodiment.
Figure 3:
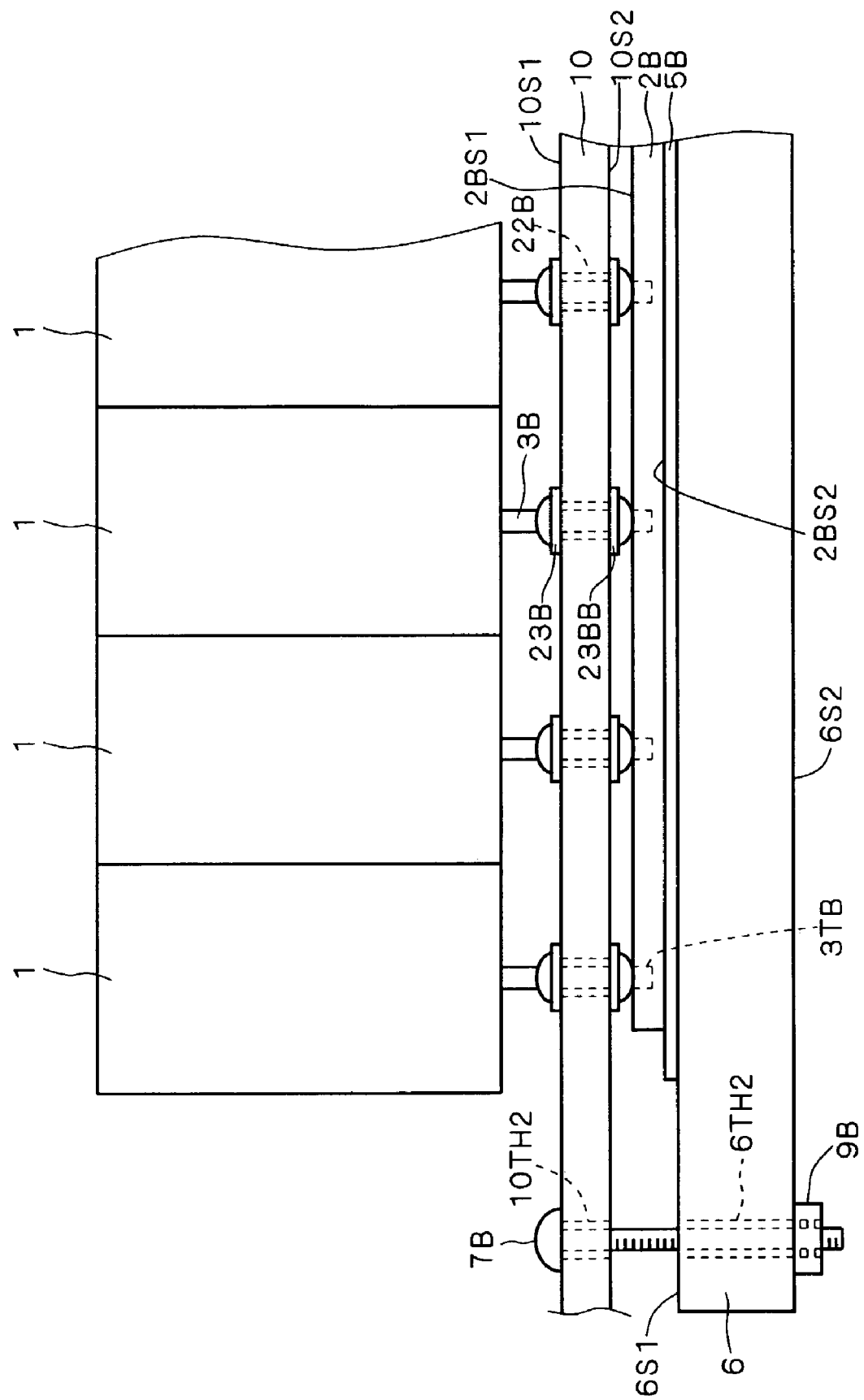

FIG. 2 is a side view of the mounting structure for the capacitor assemblies 100 of the semiconductor device as viewed in a first direction D1 of FIG. 1. FIG. 3 is a side view of the mounting structure for the capacitor assemblies 100 of the semiconductor device as viewed in a second direction D2 of FIG. 1.

As shown in FIGS. 2 and 3, on the first major surface 6S1 of the printed circuit board 6, first and second electrode patterns 5A and 5B are formed by printing which extend parallel to each other along the first direction D1. Also, as illustrated in FIGS. 1 to 3, a first through hole 6TH1, a second through hole 6TH2, and third and fourth through holes are formed in the board 6, extending through a board thickness between the first and second major surfaces 6S1 and 6S2. Besides, a fifth through hole (not shown) for a fifth bolt 7E is formed in an intermediate portion of the board 6 between the first through hole 6TH1 and the third through hole (not shown) for a third bolt 7C, and a sixth through hole (not shown) for a sixth bolt 7F is formed in an intermediate portion of the board 6 between the second through hole 6TH2 and the fourth through hole (not shown) for a fourth bolt 7D. Here, the first to sixth through holes are generically referred to as "second major through holes".

Hereinbelow, a capacitor mounting structure will be described by description of the procedure for mounting the capacitors 1 onto the board 6.

First, a mounting plate 10 of insulator is provided. In four corners of the mounting plate 10, in alignment with the aforementioned first to fourth through holes in the board 6, through holes 10TH1, 10TH2, 10TH3 and 10TH4 for first to fourth bolts respectively are formed which extend through the mounting plate 10 in a direction of thickness of the plate 10. Also, through holes 10TH5 and 10TH6 for fifth and sixth bolts respectively are formed in alignment with the aforementioned fifth and sixth through holes in the board 6, respectively. Here, the first to sixth through holes 10TH1, 10TH2, 10TH3, 10TH4, 10TH5 and 10TH6 for the mounting plate 10 are generically referred to as "first major through holes". Further in the mounting plate 10, in alignment with the position where each capacitor 1 is mounted, through holes 22A and 22B for first and second lead wires respectively are formed which extend through the mounting plate 10 through the direction of thickness of the plate 10. Besides, a conductor pattern (first upper surface side solder portion or first upper surface side land) 23A for soldering a first electrode lead wire 3A is printed on a portion of an upper surface 10S1 of the mounting plate 10 around the perimeter of each of the through holes 22A for the first lead wire, and similarly a conductor pattern (first lower surface side solder portion or first lower surface side land) 23AA for soldering the first electrode lead wire 3A is printed on a portion of a lower surface 10S2 of the mounting plate 10 around the perimeter of each of the through holes 22A for the first lead wire. Similarly, a conductor pattern (second upper surface side solder portion or second upper surface side land) 23B for soldering a second electrode lead wire 3B is printed on a portion of the upper surface 10S1 of the mounting plate 10 around the perimeter of each of the through holes 22B for the second lead wire, and a conductor pattern (second lower surface side solder portion or second lower surface side land) 23BB for soldering the second electrode lead wire 3B is printed on a portion of the lower surface 10S2 of the mounting plate 10 around the perimeter of each of the through holes 22B for the second lead wire.

Then, for each of the capacitors 1, the first and second electrode lead wires 3A and 3B are inserted respectively into the corresponding through holes 22A and 22B in the mounting plate 10 so that their respective tip portions 3TA and 3TB project from the lower surface 10S2 of the mounting plate 10, thus forming projections (there is usually some clearance after the insertion, but such clearance is not essential). Then, a middle portion of the inserted first electrode lead wire 3A is soldered at its upper side to the first upper surface side land 23A by a first upper side solder layer 4A and at its lower side to the first lower surface side land 23AA by a first lower side solder layer 4AA. Similarly, a middle portion of the inserted second electrode lead wire 3B is soldered at its upper side to the second upper surface side land 23B by a second upper side solder layer 4B and at its lower side to the second lower surface side land 23BB by a second lower side solder layer 4BB. Thereby, the first and second electrode lead wires 3A and 3B of the capacitor 1 are secured at their middle portions to the mounting plate 10. The tip portions 3TA and 3TB of both the lead wires 3A and 3B of the capacitor 1 form projections which project from the first and second lower side solder layers 4AA and 4BB, respectively. Such capacitors 1 are aligned at predetermined intervals along the first direction D1. Through the above soldering process, a plurality of capacitors 1 are located on the mounting plate 10, thus forming the aforementioned capacitor assembly 100 on the mounting plate 10.

Further, first and second spacers 2A and 2B of metal are previously provided which have a relatively flexible structure that is easily deformable under pressure and which have the shape of a flat plate extending along the first direction D1. The length of the first spacer 2A along the first direction D1 is shorter than that of the first electrode pattern 5A of the board 6 in the first direction D1, but it is long enough that the aforementioned tip portion 3TA of the first electrode lead wire 3A of each of the capacitors 1 forming the capacitor assembly 100 can, as will later be described, make mechanical and electrical contact with a first upper surface 2AS1 of the first spacer 2A. Similarly, the length of the second spacer 2B in the first direction D1 is shorter than that of the second electrode pattern 5B of the board 6 in the first direction D1, but it is long enough that the aforementioned tip portion 3TB of the second electrode lead wire 3B of each of the capacitors 1 forming the capacitor assembly 100 can, as will later be described, make mechanical and electrical contact with a second upper surface 2BS1 of the second spacer 2B.

The first and second spacers 2A and 2B are located on the surfaces of the first and second electrode patterns 5A and 5B, respectively. Thereby, a first bottom surface 2AS2 of the first spacer 2A is in mechanical contact with the first electrode pattern 5A, and similarly a second bottom surface 2BS2 of the second spacer 2B is in mechanical contact with the second electrode pattern 5B. At this stage, however, both mechanical contacts between the first bottom surface 2AS2 and the first electrode pattern 5A and between the second bottom surface 2BS2 and the second electrode pattern 5B are not satisfactory in terms of electrical connection.

Then, for each of the capacitors 1 which are secured by soldering so as to be arranged in a linear array along the first direction D1 on the mounting plate 10, the first and second tip portions 3TA and 3TB of the first and second electrode lead wires (first and second lead terminals) 3A and 3B which project from the lower surface 10S2 of the mounting plate 10 are brought into mechanical contact with the first and second spacers 2A and 2B, respectively. This establishes a first electrical connection between the first upper surface 2AS1 opposite the first bottom surface 2AS2 and the first tip portion 3TA, and a-second electrical connection between the second upper surface 2BS1 opposite the second bottom surface 2BS2 and the second tip portion 3TB. These electrical connections can be implemented by the following structure.

A first purpose of interposing the first and second spacers 2A and 2B for mounting the capacitor assembly 100 secured to the mounting plate 10 on the board 6 or, in other words, a first function of the first and second spacers 2A and 2B, is to effectively prevent, at the time of mounting of the capacitor assembly 100 to the printed circuit board 6, the first and second tip portions 3TA and 3TB which project from the lower surface 10S2 of the mounting plate 10 from being brought into direct contact with the surfaces of the first and second electrode patterns 5A and 5B of the printed circuit board 6 and thereby from damaging those printed patterns 5A and 5B.

A second purpose or function is to ensure electrical contacts and connections between the first and second electrode lead wires 3A, 3B and the first and second electrode patterns 5A, 5B on the board 6 via satisfactory mechanical contacts therebetween (or via assurance of greater contact area therebetween). Especially because the printed circuit board 6 and the mounting plate 10 are easy to deform by external forces, it is necessary to prevent a reduction in mechanical contact areas between the electrode lead wires 3A, 3B and the corresponding electrode patterns 5A, 5B due to such deformation.

From the viewpoint of implementation of the above functions, both the first and second spacers 2A and 2B of metal have a flexible structure that is easily deformable under pressure and also, they are configured to stop, on the way, the first and second tip portions 3TA and 3TB which are stuck into the first and second upper surfaces 2AS1 and 2BS1 of the spacers 2A and 2B, thereby preventing the first and second tip portions 3TA and 3TB from extending through the first and second bottom surfaces 2AS2 and 2BS2. The first and second spacers 2A and 2B each are made in, for example, a structure utilized in a shielded line, for example; that is, they are made in a flexible structure composed of a grid of first and second metal lines.

An operator moves the capacitor assembly 100 for each mounting plate 10 to locate the first and second tip portions 3TA and 3TB of each capacitor 1 on the corresponding first and second spacers 2A and 2B on the board 6. The operator then moves the mounting plate 10 in a downward direction so that the first and second tip portions 3TA and 3TB are pushed into the upper surfaces 2AS1 and 2BS1 of the first and second spacers 2A and 2B, respectively. Thereby, the first and second tip portions 3TA and 3TB are stuck into grids of metal lines in the first and second spacers 2A and 2B and are stopped within the first and second spacers 2A and 2B, respectively. That is, the tip portions 3TA and 3TB make mechanical and electrical contacts with the grids of metal lines in the corresponding spacers 2A and 2B. Conversely, because the tip portions 3TA and 3TB are stuck into the grids of metal lines in the corresponding spacers 2A and 2B, the spacers 2A and 2B are supported by the corresponding tip portions 3TA and 3TB, respectively. This readily stabilizes the positioning of the first and second spacers 2A and 2B relative to the first and second electrode patterns 5A and 5B. And, as is evident from a comparison with the case of a second modification later to be described (the case where both the electrode lead wires 3A and 3B do not project from the lower surface 10S2 of the mounting plate 10), the contact areas between the spacers 2A, 2B and the corresponding electrode lead wires 3A, 3B are increased as well and hence good mechanical contacts (first and second electrical connections) can be established between the first and second tip portions 3TA, 3TB and the first and second spacers 2A, 2B. In FIGS. 2 and 3, as a preferred example, the first and second lower side solder layers 4AA and 4BB are in contact with the upper surfaces 2AS1 and 2BS1 of the corresponding spacers 2A and 2B, respectively, to apply pressure to the spacers 2A and 2B.

In this condition, the operator tightens the bolts (including the aforementioned first to sixth bolts) and nuts to secure the mounting plate 10 onto the board 6. More specifically, the operator carries out the following work. With the first to sixth bolts 7A–7F fitted into their corresponding through holes 10TH1–10TH6 on the mounting plate 10 side and into their corresponding through holes 6TH1, 6TH2, and so on on the board 6 side, projections of the bolts 7A–7B from the second major surface 6S2 of the board 6 are tightened with corresponding nuts 8A, 8B, and so on. By this tightening of the bolts, the mounting plate 10 presses the first and second spacers 2A and 2B against the first and second electrode patterns 5A and 5B through the first and second lower side solder layers 4AA and 4BB, respectively. This further stabilizes the positioning of the first and second spacers 2A and 2B relative to the first and second electrode patterns 5A and 5B and establishes a substantially desirable level of mechanical and electrical contacts (contact areas) between the spacers 2A, 2B and the corresponding electrode patterns 5A, 5B. In this way, the first bolt 7A and the first nut 8A form a "first support" for the mounting plate 10, the second bolt 7B and the second nut 8B form a "second support", the third bolt 7C and the corresponding third nut form a "third support", the fourth bolt 7D and the corresponding fourth nut form a "fourth support", the fifth bolt 7E and the corresponding fifth nut form a "fifth support", and the sixth bolt 7F and the corresponding sixth nut form a "sixth support". These supports are herein generically referred to as a "mounting plate support part".

Alternatively, by controlling the tightening of the bolts and the nuts, a clearance may be created between the first and second lower side solder layers 4AA, 4BB and the upper surfaces 2AS1, 2BS1 of the corresponding spacers 2A, 2B.

The use of the aforementioned capacitor mounting structure brings the following advantages. When the need to replace the capacitors 1 with new ones arises from the termination of the lifetime of the capacitors 1, the operator can, by only loosening the tightened bolts which secure the mounting plate 10 and the board 6, readily demount the entire mounting plate 10 which includes all the capacitors 1 forming the capacitor assembly 100 from the board 6 at a time, and immediately after that, the operator can mount a new capacitor assembly 100 on the board 6 by only performing another bolt tightening work on another mounting plate 10 on which the new capacitor assembly 100 have previously been secured. This replacement work for the capacitors 1 requires no melting work for solder layers and no soldering work.

(First Modification)

As shown in FIG. 4 which corresponds to FIG. 2, first and second conductive greases G1 and G2 may be provided at the interface between the electrode lead wires 3A, 3B and the corresponding spacers 2A, 2B, e.g., at the interface between the tip portions 3TA, 3TB and corresponding grids of metal lines. This structure can further reduce contact resistance (and hence electric resistance) at the contact portions between the electrode lead wires 3A, 3B and the corresponding spacers 2A, 2B.

(Second Modification)

Figure 5:
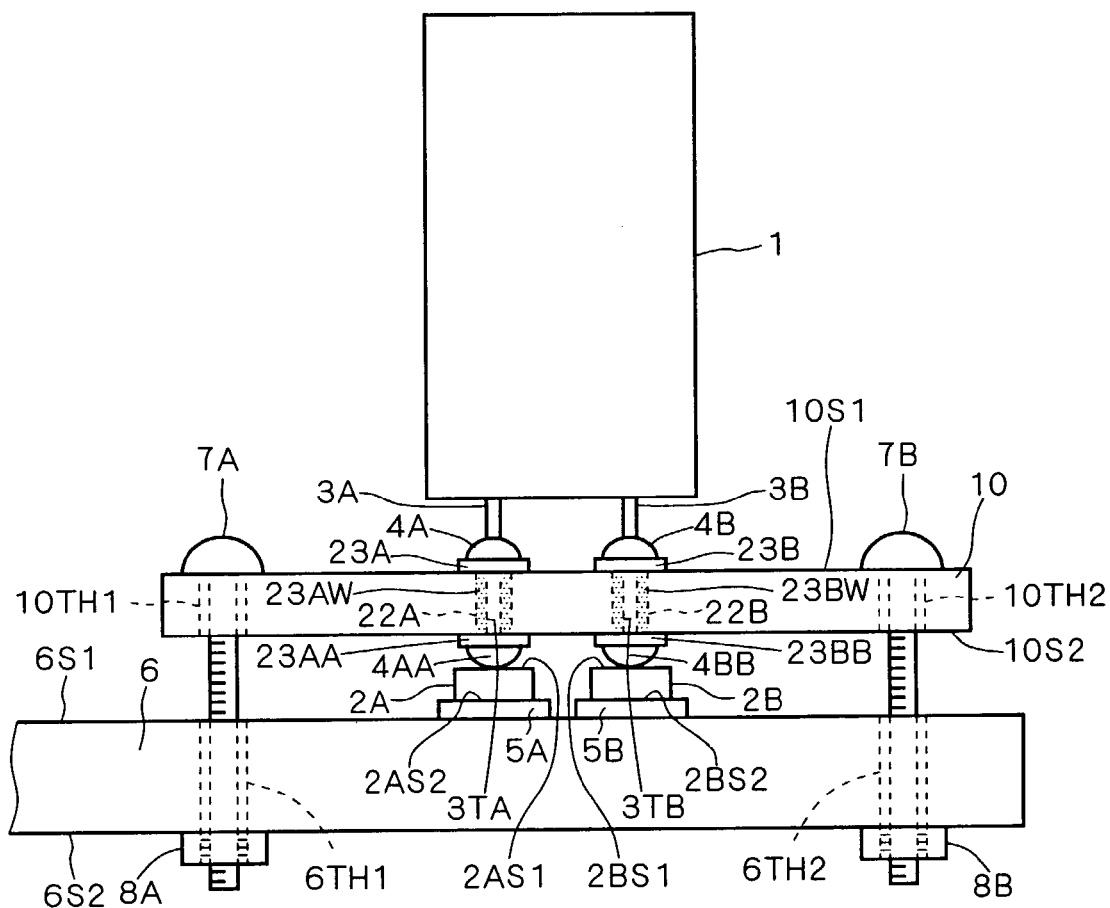
FIG. 5 is a side view showing a capacitor mounting structure according to a second modification.

As shown in FIG. 5 which corresponds to FIG. 2, the first electrical connection between the first tip portion 3TA and the first upper surface 2AS1 of the first spacer 2A and the second electrical connection between the second tip portion 3TB and the second upper surface 2BS1 of the second spacer 2B may be established by bringing the first and second lower side solder layers 4AA and 4BB into direct mechanical contact with the upper surfaces 2AS1 and 2BS1 of the corresponding second spacers 2A and 2B, without protrusion of the first and second tip portions 3TA and 3TB of the first and second electrode lead wires 3A and 3B from the lower surface 10S2 of the mounting plate 10. In this case, however, it is absolutely necessary that conductive patterns 23AW and 23BW for providing electrical connections between the upper and lower side lands (23A, 23AA) and (23B, 23BB) be printed on the walls of the first and second through holes 22A and 22B on the mounting plate 10 side. In the first preferred embodiment, the provision of the conductive patterns 23AW and 23BW is an optional design consideration.

In the present invention, therefore, the "first tip portion 3TA which is electrically connected to the first upper surface 2AS1" and the "second tip portion 3TB which is electrically connected to the second upper surface 2BS1" are used as common terms or concepts including both the structures of the first preferred embodiment and the second modification.

Second Preferred Embodiment

This preferred embodiment provides another capacitor mounting structure in which capacitor assemblies are readily removable from a printed circuit board without interposing spacers as in the first preferred embodiment and without requiring any solder melting work and soldering work. However, this preferred embodiment also basically employs the semiconductor device structure of FIG. 1, except that the mounting plates 10 in FIG. 1 are replaced by mounting members or blocks which will later be described. Thus, the heart of this preferred embodiment is the above mounting members. Hereinbelow, the capacitor mounting structure according to this preferred embodiment is described in detail with reference to FIGS. 6 and 7.

Figure 6:
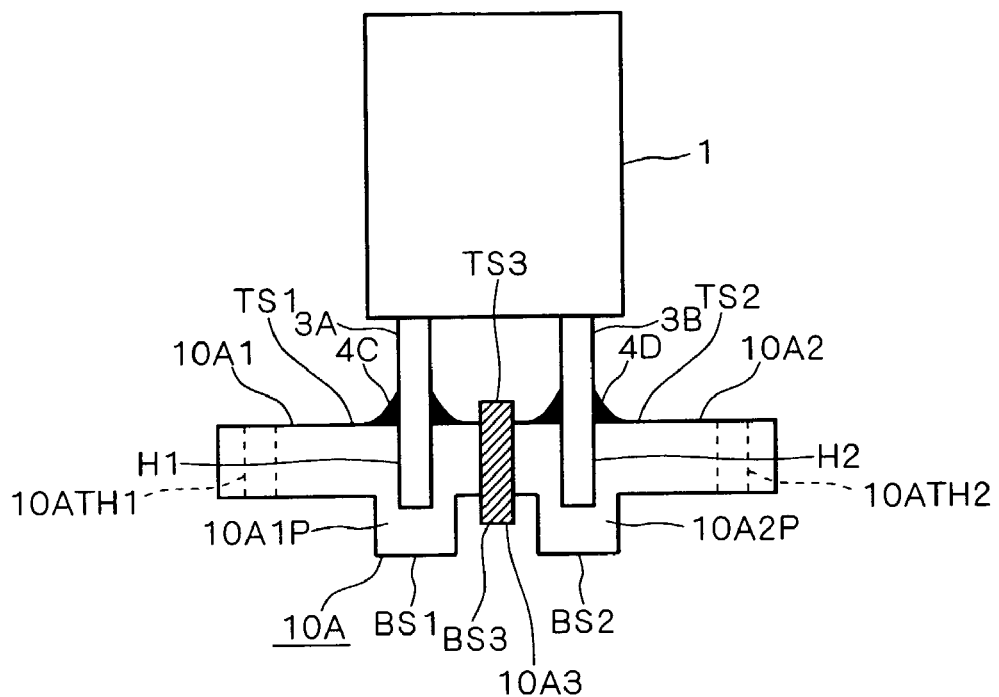
FIGS. 6 and 7 are side views showing a capacitor mounting structure according to a second preferred embodiment.
Figure 7:
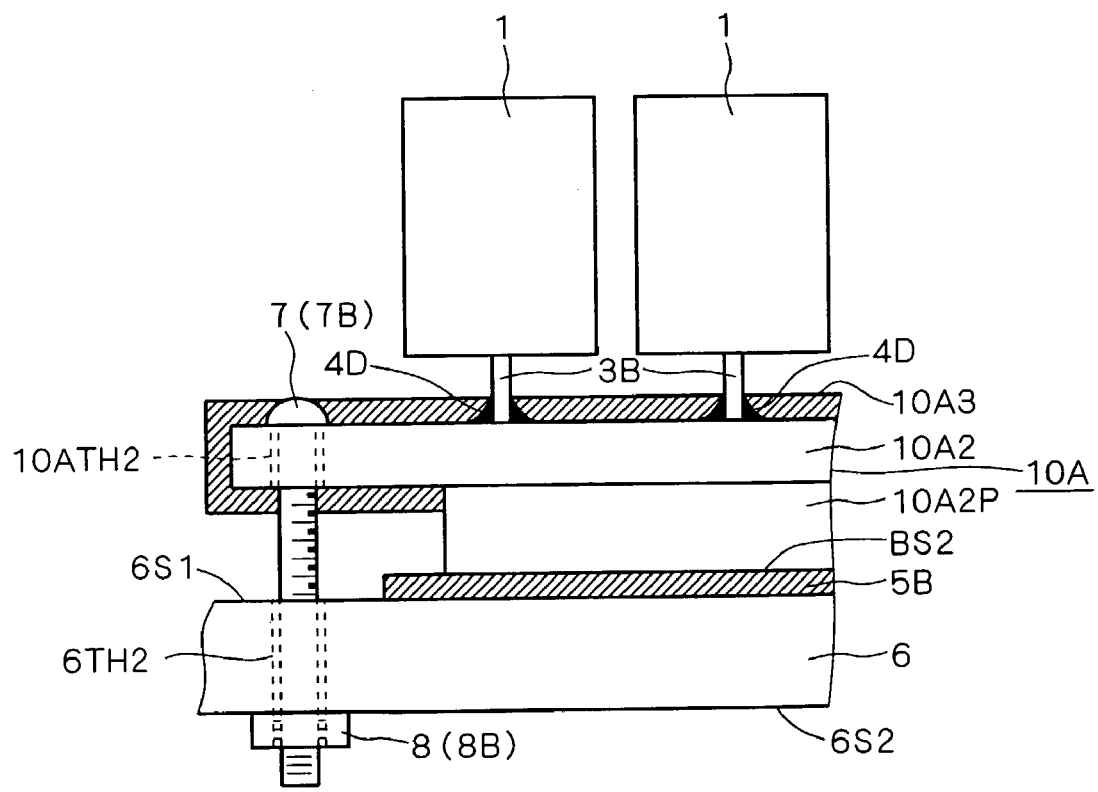

FIG. 6 is a side view of the capacitor mounting structure as viewed from the first direction D1 of FIG. 1. For convenience in drawing, a contact structure of a mounting member 10A and the insulating board 6 is not shown in FIG. 6. FIG. 7 is a side view of the capacitor mounting structure as viewed from the second direction D2 of FIG. 1, showing the contact structure of the mounting member 10A and the insulating board 6.

As shown in FIG. 6, the mounting member 10A comprises a first mounting conductor portion 10A1 of a conductivity type which extends in the first direction D1 and a second mounting conductor portion 10A2 of a conductivity type which extends parallel to the first mounting conductor portion 10A1 in the first direction D1. The first mounting conductor portion 10A1 has a first projection 10A1P having a first flat bottom surface BS1 and extending in the first direction D1 and uses a metal such as copper for the base member. The second mounting conductor portion 10A2 has a second projection 10A2P having a second flat bottom surface BS2, uses a metal such as copper for the base member, and is of the same shape and size as the first mounting conductor portion 10A1. The first and second mounting conductor portions 10A1 and 10A2 need not always be of the same shape and size with each other. The mounting member 10A further comprises an isolation insulator 10A3 of insulation which extends parallel to the mounting conductor portions 10A1 and 10A2 in the first direction D1 (and the length of which in the first direction D1 is slightly longer than those of the mounting conductor portions 10A1 and 10A2) and is sandwiched between and bonded (by, for example, an adhesive) to the mounting conductor portions 10A1 and 10A2, thereby providing electrical insulation of the mounting conductor portions 10A1 and 10A2 from each other. This isolation insulator 10A3 is made of, for example, epoxy resins, mica or plastics. The mounting conductor portions 10A1 and 10A2 have first and second holes H1 and H2, respectively, which extend from first and second upper surfaces TS1 and TS2 of the mounting conductor portions 10A1 and 10A2 into the corresponding projections 10A1P and 10A2P but not extend through the mounting conductor portions 10A1 and 10A2. A third upper surface TS3 of the isolation insulator 10A3 projects upward from the first and second upper surfaces TS1 and TS2 of the mounting conductor portions 10A1 and 10A2, and conversely the first and second bottom surfaces BS1 and BS2 of the mounting conductor portions 10A1 and 10A2 extend downwardly beyond the third bottom surface BS3 of the isolation insulator 10A3. The mounting member 10A, along the first direction D1, is of such a dimension that it can mount all electrolytic capacitors 1 in the capacitor assembly 100. That is, pairs of first and second holes H1 and H2 are formed along the first direction D1 in alignment with an alignment pitch of the electrolytic capacitors 1 in the capacitor assembly 100.

The first and second electrode lead wires 3A and 3B of each of the capacitors 1 are inserted respectively into a corresponding pair of first and second holes H1 and H2, and their respective middle portions are soldered respectively to the first and second upper surfaces TS1 and TS2 by first and second solder layers 4C and 4D.

Referring next to FIG. 7, in view of an operation process, electrical connections between the first and second electrode lead wires 3A, 3B and the first and second electrode patterns 5A, 5B will be described which are established via mechanical contacts between the mounting member 10A having all the electrolytic capacitors 1 in the capacitor assembly 1 secured thereto, and the first and second electrode patterns 5A, 5B printed on the board 6. A distance between the central axes of the first and second projections 10A1P and 10A2P is equivalent to a distance (pitch) between the central axes of the first and second electrode patterns 5A and 5B on the board 6 side.

First, the mounting member 10A equipped with the capacitors 1 is previously provided. An operator mounts this mounting member 10A itself on the surfaces of the first and second electrode patterns 5A and 5B. Thereby, the first flat bottom surface BS1 of the first projection 10A1P and the second flat bottom surface BS2 of the second projection 10A2, which are being isolated from each other, are brought into mechanical and electrical contact with the upper surfaces of the first and second electrode patterns 5A and 5B, respectively. At this time, since contact areas are relatively wide and contact itself is stable, electrical connections between the electrode lead wires 3A, 3B and the corresponding electrode patterns 5A, 5B can be ensured with stability.

After that, as in the first preferred embodiment, the mounting member 10A and the board 6 are secured by the tightening of a mounting member support part including the bolts and the nuts. This further enhances the stability of a first mechanical and electrical contact between the first bottom surface BS1 and the first electrode pattern 5A and a second mechanical and electrical contact between the second bottom surface BS2 and the second electrode pattern 5B.

The use of the aforementioned capacitor mounting structure can also achieve similar effects as described in the first preferred embodiment. That is, when the need to replace the capacitors 1 with new ones arises from the termination of the lifetime of the capacitors 1, the operator can, by only loosening the tightened bolts which secure the mounting member 10A and the board 6, readily demount the entire mounting member 10A which includes all the capacitors 1 forming the capacitor assembly 100 from the board 6, and immediately after that, the operator can mount a new capacitor assembly 100 on the board 6 by only performing another bolt tightening work on another mounting member 10A on which the new capacitor assembly 1 have previously been secured. This replacement work for the capacitors 1 requires no melting work for solder layers and no soldering work.

(Third Modification)

Figure 8:
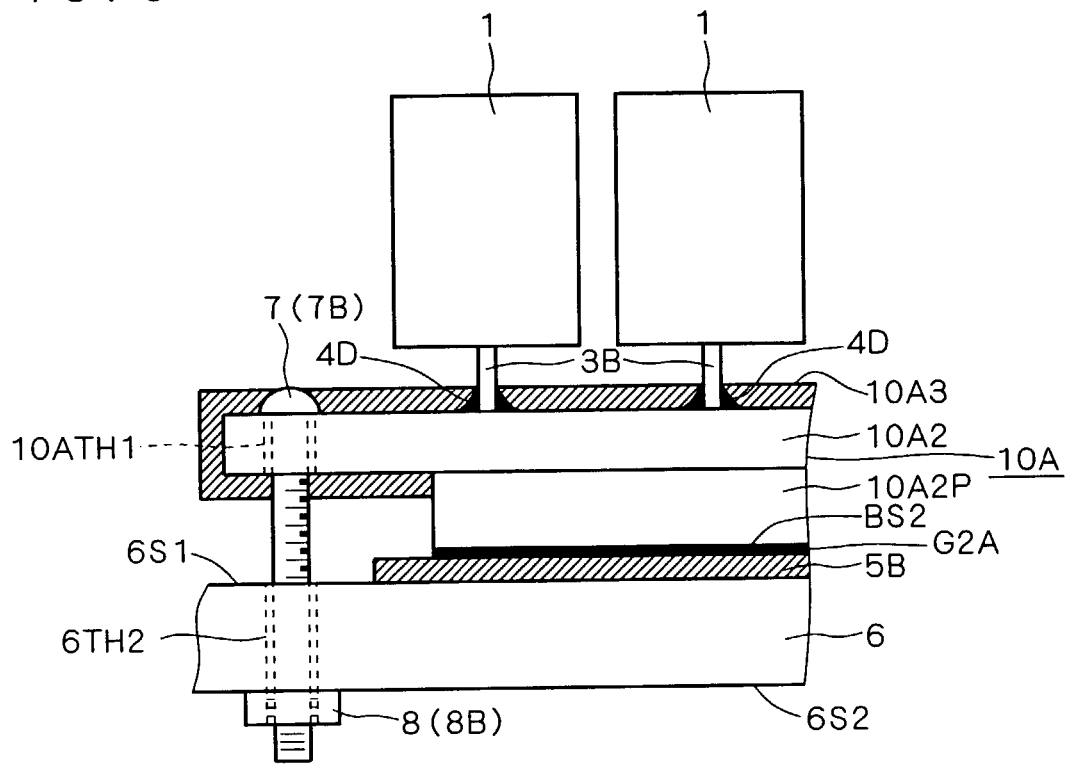
FIG. 8 is a side view showing a capacitor mounting structure according to a third modification.

The following modification may be made to the structure of the second preferred embodiment. As shown in FIG. 8 which corresponds to FIG. 7, a first conductive grease may be applied between the first bottom surface BS1 of the first projection 10A1P and the upper surface of the first electrode pattern 5A, and/or a second conductive grease G2A may be applied between the second bottom surface BS2 of the second projection 10A2P and the upper surface of the second electrode pattern 5B. This modification can reduce contact resistance at the contact surfaces between the first and/or second projections 10AlP, 10A2P and the corresponding electrode patterns 5A, 5B and can further improve the first and second electrical contacts.

(Fourth Modification)

Figure 9:
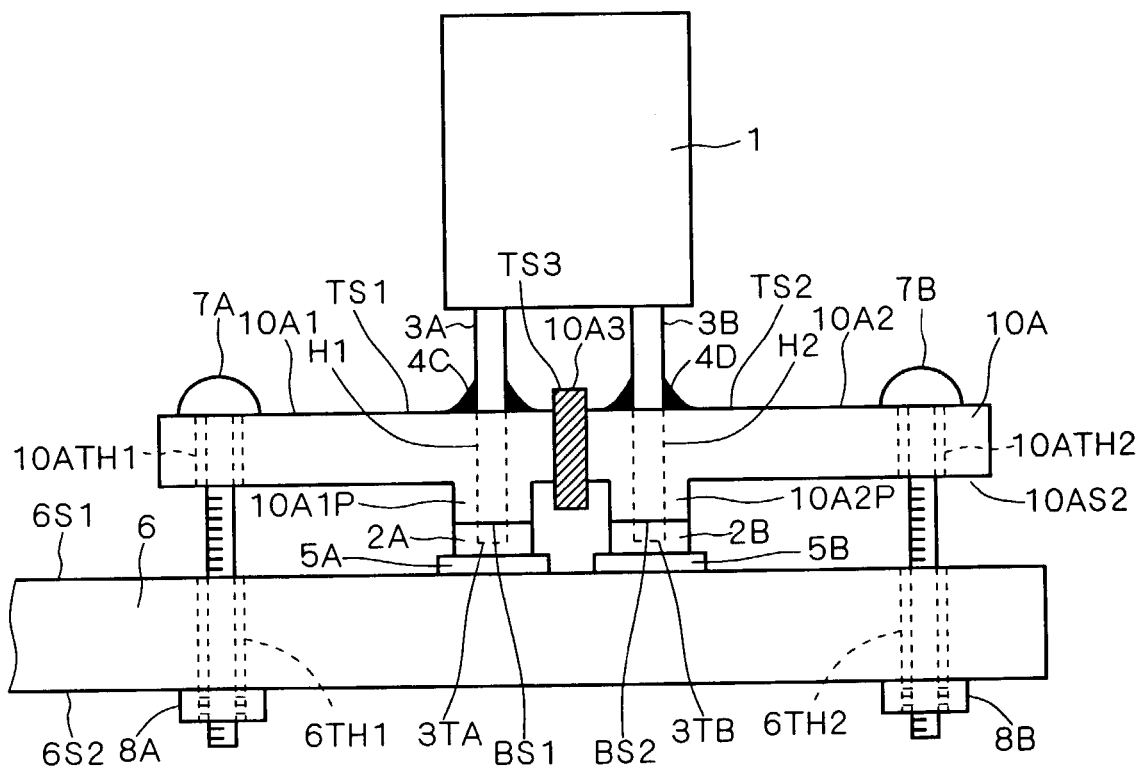
FIG. 9 is a side view showing a capacitor mounting structure according to a fourth modification.

As shown in FIG. 9 which corresponds to a combination of FIGS. 2 and 6, the first and second spacers 2A and 2B employed in the first preferred embodiment may be interposed between the mounting member 10A and the board 6 in the second preferred embodiment. In this case, the tip portions 3TA and 3TB of the electrode lead wires 3A and 3B project from the bottom surfaces BS1 and BS2 of the corresponding projections 10A1P and 10A2P, thereby forming projections. This modification can also achieve similar effects as described in the first and second preferred embodiments.

Third Preferred Embodiment

Figure 10:
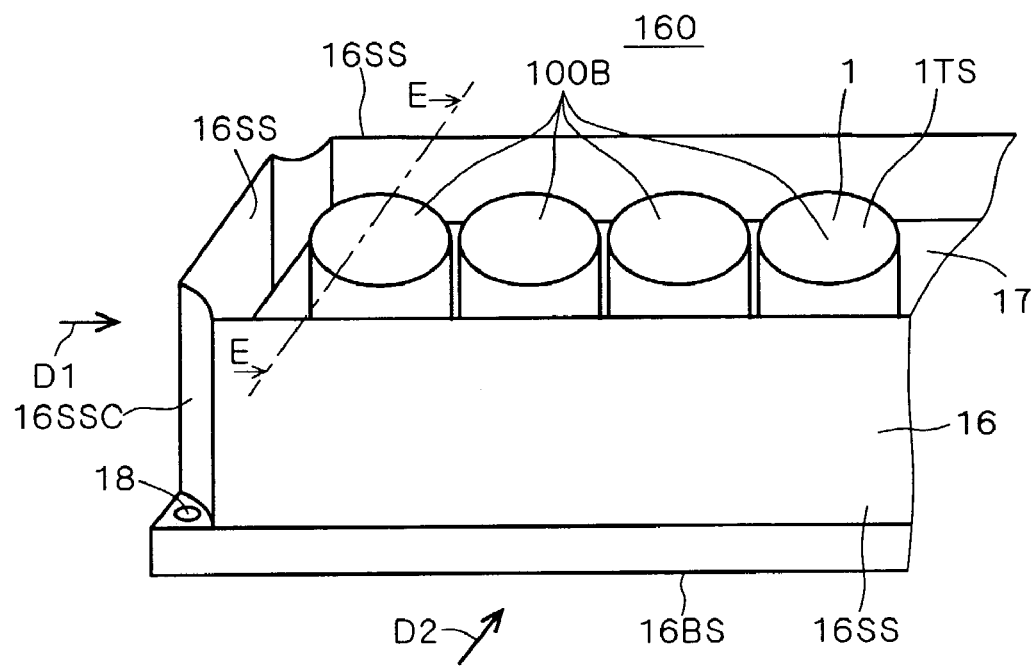
FIG. 10 is a perspective view showing a capacitor mounting structure according to a third preferred embodiment.
Figure 11:
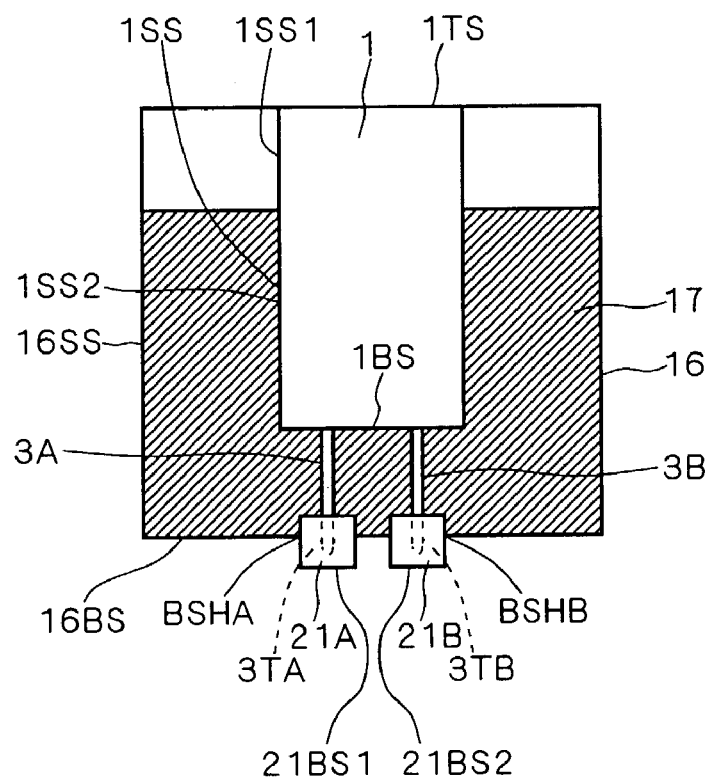
FIG. 11 is a cross-sectional view showing the capacitor mounting structure according to the third preferred embodiment.
Figure 12:
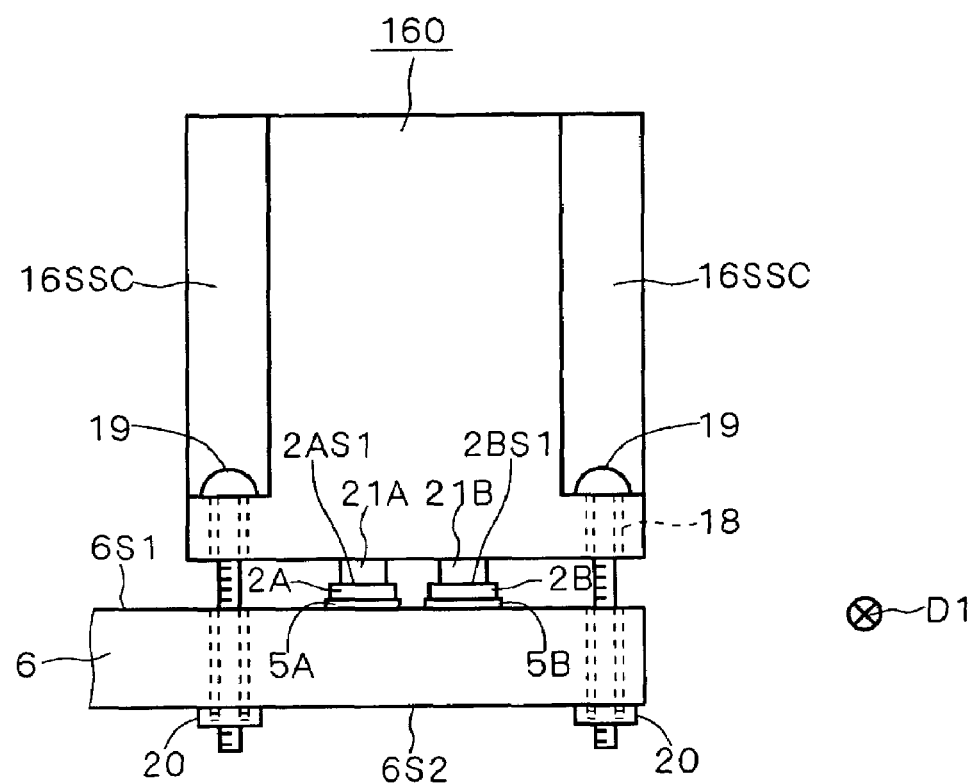
FIG. 12 is a side view showing the capacitor mounting structure according to the third preferred embodiment.

FIG. 10 is a perspective view of a capacitor assembly casing 160 which forms the heart of a capacitor mounting structure according to this preferred embodiment, FIG. 11 is a longitudinal sectional view of the capacitor assembly casing 160 taken along the line E—E of FIG. 10, and FIG. 12 is a side view of the capacitor mounting structure corresponding to FIG. 2. This preferred embodiment also employs the semiconductor device shown in FIG. 1, except that the capacitor assembly 100 secured on the mounting plate 10 in FIG. 1 is replaced by a capacitor assembly 100B held in the casing shown in FIG. 10, i.e., a capacitor assembly casing 160 is employed herein.

The following description is of the features and selling points of this preferred embodiments.

Firstly, for higher earthquake resistance than in the capacitor mounting structures shown in FIGS. 2 to 9, the capacitor assembly 100B is covered with a filler material 17 of resin. At this time, the top of each of the capacitors 1 needs to be open to the outside world without being sealed, in order to readily find a defective capacitor 1 from the outside when a breakdown occurs in any of the electrolytic capacitors 1 from any cause. Thus, for each of the capacitors 1, except an upper surface 1TS and a portion 1SS1 of a side surface 1SS near the upper surface 1TS, only a remaining portion 1SS2 of the side surface 1SS and a bottom surface 1BS, and the first and second electrode lead wires (lead terminals) 3A and 3B are covered with the resin 17. The resin 17 also covers upper surfaces of first and second electrode bodies 21A and 21B, which will later be described, and parts of side surfaces thereof near the upper surfaces.

Secondly, further in this preferred embodiment, for higher strength, the capacitor assembly 100B which is covered with the resin 17 but whose upper side remains open is enclosed in a lidless case (outer case) of insulation 16. This forms the aforementioned capacitor assembly casing 160. Each corner 16SSC of a side surface 16SS of the case 16 forms a curvature which is cut to form a through hole 18 for use in bolt tightening which will later be described. In the bottom surface 16BS of the case 16, in alignment with an alignment pitch of the capacitors 1 with respect to the first direction D1, first and second openings BSHA and BSHB are formed to fit therein the first and second electrode bodies (first and second metal bodies) 21A and 21B for the first and second electrode lead wires 3A and 3B. For each of the capacitors 1, the tip portions 3TA and 3TB of the first and second electrode lead wires 3A and 3B are inserted into non-through holes formed in the first and second electrode bodies 21A and 21B for the capacitor 1 and then, for example by soldering, electrically connected to the first and second electrode bodies 21A and 21B. This connection work is, in practice, conducted before all the capacitors 1 are covered with the resin 17.

Thirdly, approximately flat bottom surfaces 21BS1 and 21BS2 of the first and second electrode bodies 21A and 21B for each of the capacitors 1 have mechanical face-to-face contact with the approximately flat first and second upper surfaces 2AS1 and 2BS1 of the corresponding spacers 2A and 2B which have mechanical surface contact with the surfaces of the first and second printed conductor patterns 5A and 5B. Here, the first and second printed conductor patterns 5A, 5B and the first and second spacers 2A, 2B are identical to those described in the first preferred embodiment. Thus, the tip portions 3TA and 3TB of the first and second electrode lead wires 3A and 3B for each of the capacitors 1 are electrically connected through the corresponding electrode bodies 21A, 21B and the corresponding spacers 2A, 2B to the corresponding electrode patterns 5A and 5B, respectively.

Fourthly, while keeping the aforementioned mechanical surface contact, bolts 19 and nuts 20 are tightened to secure the case 16 to the printed circuit board 6. This tightening of the bolts further stabilizes and ensures a first surface contact between the first and second electrode bodies 21A, 21B and the first and second spacers 2A, 2B and a second surface contact between the first and second spacers 2A, 2B and the first and second electrode patterns 5A, 5B.

The use of the aforementioned capacitor mounting structure can also bring similar advantages as described in the first preferred embodiment. That is, when the need to replace the capacitors 1 with new ones arises from the termination of the lifetime of the capacitors 1, the operator can, by only loosening the tightened bolts which secure the case 16 and the board 6, readily demount the entire case 16 which includes all the capacitors 1 forming the capacitor assembly 100B from the board 6, and immediately after that, the operator can mount a new capacitor assembly 100B on the board 6 by only performing another bolt tightening work on another case 16 on which the new capacitor assembly 100B have previously been secured. This replacement work for the capacitors 1 requires no melting work for solder layers and no soldering work.

(Additional Remark)

It is apparent that the "capacitors" as can be seen as the subject of the present invention are not limited to electrolytic capacitors and a structure for mounting a capacitor comprising two lead terminals have general applicability. Alternatively, a ceramic board having a thick-film printed conductor pattern may be employed as the "control board 10".

While the invention has been shown and described in detail, the foregoing description is in all aspects illustrative and not restrictive. It is therefore understood that numerous modifications and variations can be devised without departing from the scope of the invention.

What is claimed is:

1. A capacitor mounting structure comprising:
   a board having a first major surface which has first and second electrode patterns formed thereon, and a second major surface facing said first major surface;
   a first spacer of metal being deformable in structure and having a first bottom surface which is in mechanical contact with said first electrode pattern and a first upper surface facing said first bottom surface;
   a second spacer of metal being deformable in structure and having a second bottom surface which is in mechanical contact with said second electrode pattern and a second upper surface facing said second bottom surface; and
   a capacitor having a first electrode lead wire which has a first tip portion electrically connected to said first upper surface, and a second electrode lead wire which has a second tip portion electrically connected to said second upper surface, wherein
   said first tip portion makes a mechanical contact with said first spacer by being stuck into said first spacer and is located immediately above said first electrode pattern, and
   said second tip portion makes a mechanical contact with said second spacer by being stuck into said second spacer and is located immediately above said second electrode pattern.

2. The capacitor mounting structure according to claim 1, wherein
   said first spacer comprises a first metal line which is in the form of a grid and in contact with said first tip portion, and
   said second spacer comprises a second metal line which is in the form of a grid and in contact with said second tip portion.

3. The capacitor mounting structure according to claim 2, further comprising:
   a first conductive grease applied at an interface between said first metal line and said first tip portion; and
   a second conductive grease applied at an interface between said second metal line and said second tip portion.

4. The capacitor mounting structure according to claim 1, further comprising:
   a mounting plate to which middle portions of said first and second electrode lead wires of said capacitor are secured so as to protrude said first and second tip portions, said mounting plate having first major through holes for receiving bolts, each of which is formed in each of at least two corners of said mounting plate, wherein
   said board further has second major through holes for receiving said bolts, each of which is formed in each position to face each of said first major through holes, and
   said mounting plate and said board are secured to each other, using said first and second major through holes.

5. A capacitor mounting structure comprising:
   a board having a first major surface which has first and second electrode patterns formed thereon, and a second major surface facing said first major surface;
   a first spacer of metal being deformable in structure and having a first bottom surface which is in mechanical contact with said first electrode pattern and a first upper surface facing said first bottom surface;
   a second spacer of metal being deformable in structure and having a second bottom surface which is in mechanical contact with said second electrode pattern and a second upper surface facing said second bottom surface;
   a capacitor having a first electrode lead wire which has a first tip portion electrically connected to said first upper surface, and a second electrode lead wire which has a second tip portion electrically connected to said second upper surface;
   a mounting plate comprising at least two corners each having one of first major through holes for receiving bolts,
   wherein said board further has second major through holes for receiving said bolts, each of which is formed in each position to face a corresponding one of said first major through holes,
   said mounting plate further comprising:
   first and second through holes each extending through said mounting plate and having a conductive pattern printed on its entire wall surface;
   a first upper side land being printed on an area of an upper surface of said mounting plate around an upper side perimeter of said first through hole, and being electrically connected to said conductor pattern of said first through hole;
   a second upper side land being printed on an area of said upper surface of said mounting plate around an upper side perimeter of said second through hole, and being electrically connected to said conductor pattern of said second through hole;

a first lower side land being printed on an area of a lower surface of said mounting plate around a lower side perimeter of said first through hole, and being electrically connected to said conductor pattern of said first through hole;

a second lower side land being printed on an area of said lower surface of said mounting plate around a lower side perimeter of said second through hole, and being electrically connected to said conductor pattern of said second through hole;

a first lower side solder layer formed on said first lower side land and in direct physical contact with said first upper surface of said first spacer; and a second lower side solder layer formed on said second lower side land and in direct physical contact with said second upper surface of said second spacer, wherein said first and second electrode lead wires of said capacitor are inserted respectively into said first and second through holes, wherein said first and second tip portions are located respectively within said first and second through holes without projecting therefrom, said mounting plate further comprising:

a first upper side solder layer formed on said first upper side land to provide electrical coupling between a middle portion of said first tip portion and said first upper side land; and a second upper side solder later formed on said second upper side land to provide electrical coupling between a middle portion of said second tip portion and said second upper side land, wherein said mounting plate and said board are secured to each other, using said first and second major through holes.

6. A capacitor mounting structure comprising:

a board having a first major surface which has first and second electrode patterns formed thereon, and a second major surface facing said first major surface;

a mounting member comprising a first mounting conductor portion, a second mounting conductor portion, and an isolation insulator sandwiched between said first and second mounting conductor portions, said first mounting conductor portion having a first projection which has a first bottom surface making electrical contact with first electrode pattern, said second mounting conductor portion having a second projection which has a second bottom surface making electrical contact with said second electrode pattern; and a capacitor having a first electrode lead wire which has a first tip portion electrically connected to said first mounting conductor portion, and a second electrode lead wire which has a second tip portion electrically connected to said second mounting conductor portion, said first and second mounting conductor portions have a through hole for receiving a bolt formed in each corner thereof, said board further has a through hole for receiving said bolt in each position to face said through hole formed in said each corner of said first and second mounting conductor portions, and said mounting member and said board are secured to each other, using said through hole formed in said each corner of said first and second mounting conductor portions and said through hole formed in said each position of said board.

7. The capacitor mounting structure according to claim 6, wherein said first bottom surface of said first projection is in direct physical contact with said first electrode pattern, and said second bottom surface of said second projection is in direct physical contact with said second electrode pattern.

8. The capacitor mounting structure according to claim 6, further comprising:

a first conductive grease applied at an interface between said first electrode pattern and said first bottom surface of said first projection, and a second conductive grease applied at an interface between said second electrode pattern and said second bottom surface of said second projection.

9. The A capacitor mounting structure comprising:

a board having a first major surface which has first and second electrode patterns formed thereon, and a second major surface facing said first major surface;

a mounting member comprising a first mounting conductor portion, a second mounting conductor portion, and an isolation insulator sandwiched between said first and second mounting conductor portions, said first mounting conductor portion having a first projection which has a first bottom surface making electrical contact with first electrode pattern, said second mounting conductor portion having a second projection which has a second bottom surface making electrical contact with said second electrode pattern;

a capacitor having a first electrode lead wire which has a first tip portion electrically connected to said first mounting conductor portion, and a second electrode lead wire which has a second tip portion electrically connected to said second mounting conductor portion;

a first spacer of metal which is deformable and interposed between said first electrode pattern and said first bottom surface of said first projection, and a second spacer of metal which is deformable and interposed between said second electrode pattern and said second bottom surface of said second projection.

10. A capacitor mounting structure comprising:

a board having a first major surface which has first and second electrode patterns formed thereon, and a second major surface facing said first major surface;

a first spacer of metal being deformable in structure and having a first bottom surface which is in mechanical contact with said first electrode pattern and a first upper surface facing said first bottom surface;

a second spacer of metal being deformable in structure and having a second bottom surface which is in mechanical contact with said second electrode pattern and a second upper surface facing said second bottom surface;

a plurality of capacitors each having first and second lead wires; and a case with no top cover, said case having side and bottom surfaces and containing said plurality of capacitors within its inside space enclosed with said side and bottom surfaces, said case further having first and second electrode bodies, said first electrode body being formed in said bottom surface of said case in alignment with a position of said first electrode lead wire of each of said plurality of capacitors and having a first bottom surface which projects from said bottom surface of said case to make mechanical contact with said first upper surface of said first spacer, said second electrode body being formed in said bottom surface of said case in alignment with a position of said second electrode lead wire of each of said plurality of capacitors and having a second bottom surface which projects from said bottom surface of said case to make mechanical contact with said second upper surface of said second spacer, wherein a first tip portion of said first electrode lead wire of each of said plurality of capacitors is electrically coupled to said first electrode body within said case, a second tip portion of said second electrode lead wire of each of said plurality of capacitors is electrically coupled to said second electrode body within said case, said capacitor mounting structure further comprising:

a filler material filling said inside space of said case while exposing an upper surface of each of said plurality of capacitors and a side surface portion thereof near said upper surface, thereby to cover said plurality of capacitors.

11. The capacitor mounting structure according to claim 10, wherein each corner of said side surface of said case is cut except a portion near said bottom surface of said case, said portion of said each corner near said bottom surface of said case has a through hole for receiving a bolt, said board further has a through hole for receiving said bolt, in a position to face said through hole formed in said each corner, and said case and said board are secured to each other, using said through hole formed in said each corner and said through hole formed in said board corresponding to said through hole formed in said each corner.

12. A semiconductor device comprising:

the capacitor mounting structure according to claim 1; and a semiconductor element mounted on said board in the capacitor mounting structure.

13. A semiconductor device comprising:

the capacitor mounting structure according to claim 6; and a semiconductor element mounted on said board in the capacitor mounting structure.

14. A semiconductor device comprising:

the capacitor mounting structure according to claim 10; and a semiconductor element mounted on said board in the capacitor mounting structure.

\* \* \* \* \*